(12) United States Patent
Liu et al.

(10) Patent No.: US 11,955,976 B2
(45) Date of Patent: Apr. 9, 2024

(54) QUADRANT ALTERNATE SWITCHING PHASE INTERPOLATOR AND PHASE ADJUSTMENT METHOD

(71) Applicant: REALTEK SEMICONDUCTOR CORPORATION, Hsinchu (TW)

(72) Inventors: Yao-Chia Liu, Hsinchu (TW); Yuan-Sheng Lee, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/973,706

(22) Filed: Oct. 26, 2022

(65) Prior Publication Data
US 2023/0136927 A1 May 4, 2023

(30) Foreign Application Priority Data
Oct. 29, 2021 (TW) .................................. 110140265

(51) Int. Cl.
*H03K 5/00* (2006.01)
*H03K 5/131* (2014.01)
(Continued)

(52) U.S. Cl.
CPC ............ *H03K 5/135* (2013.01); *H03K 5/131* (2013.01); *H03K 5/15093* (2013.01); *H03K 19/1737* (2013.01)

(58) Field of Classification Search
CPC .... H03K 5/135; H03K 5/131; H03K 5/15093; H03K 19/1737
See application file for complete search history.

(56) References Cited

U.S. PATENT DOCUMENTS 7,389,931 B2 * 6/2008 Chiu .................. G06K 7/10702
235/462.35
8,742,807 B1 * 6/2014 Muthali .................... H03L 7/00
327/146
(Continued)

OTHER PUBLICATIONS

OA letter of a counterpart TW application (appl. No. 110140265) dated Aug. 15, 2022.Summary of the TW OA letter in regard to the TW counterpart application:1. Claims 1-3, 6-8, and 10 are rejected as allegedly being unpatentable over cited reference 1 (U.S. Pat. No. 8,947,147 B1).2. Claims 4-5 and 9 are allowable.Correspondence between claims of TW counterpart application and claims of US application:1. Claims 1-5, 6-8, 9, and 10 in TW counterpart application correspond to claims 1-5, 10-12, 14, and 17 in US application, respectively.
(Continued)

*Primary Examiner* — Tuan T Lam
(74) *Attorney, Agent, or Firm* — WPAT, P.C

(57) ABSTRACT

A quadrant alternate switching phase interpolator includes first and second multiplexer circuits, a phase interpolator circuitry, and a controller circuitry. The first multiplexer circuit outputs one of first and second clock signals to be a first signal in response to first and third bits in a quadrant control code. The second multiplexer circuit outputs one of third and fourth clock signals to be a second signal in response to second and fourth bits in the quadrant control code, and the first, the third, the second, and the fourth clock signals are sequentially different in phase by 90 degrees. The phase interpolator circuitry generates an output clock signal in response to the first and the second signals and phase control bits. The controller circuitry performs a bit-shift operation on the phase control bits to adjust a phase of the output clock signal.

20 Claims, 8 Drawing Sheets

(51) Int. Cl.
*H03K 5/135* (2006.01)
*H03K 5/15* (2006.01)
*H03K 19/173* (2006.01)

(56) References Cited

U.S. PATENT DOCUMENTS

| | | | |
|---|---|---|---|
| 8,947,147 B1* | 2/2015 | Zhang | H04L 27/18 327/256 |
| 2014/0146932 A1* | 5/2014 | Song | H04L 7/0029 375/371 |
| 2021/0203473 A1* | 7/2021 | Basil | H03L 7/0807 |

OTHER PUBLICATIONS

Tsimpos, A., Demartinos, A.C., Souliotis, G., & Vlassis, S. (2016). Multi-rate phase interpolator for high speed serial Interfaces. Microelectron. J., 54, 40-47.

* cited by examiner

QUADRANT ALTERNATE SWITCHING PHASE INTERPOLATOR AND PHASE ADJUSTMENT METHOD

BACKGROUND OF THE INVENTION

1. Field of the Invention

The present disclosure relates to a phase interpolator, especially to a quadrant alternate switching phase interpolator and a phase adjustment method that are suitable for high-speed applications.

2. Description of Related Art

Conventional phase interpolators usually have high hardware complexity. As a result, the hardware area and power consumption will be too large, which may result in a large parasitic capacitance to limit the phase update rate. Quadrant switching phase interpolator is proposed to improve the above problems. However, the existing quadrant switching phase interpolators use multiple four-to-one multiplexers and multiple phase buffers to switch the quadrant corresponding to the phase. In an existing quadrant switching phase interpolator, when the quadrant of the current phase is switched to a next quadrant, outputs of those four-to-one multiplexers are all switched, and weights corresponding to those phase buffers are required to be adjusted as well. Accordingly, it will generate obvious jitter(s) on a clock signal outputted from the quadrant switching phase interpolator, or it will make the clock signal disappear. As a result, operations of other circuits in the system that receive the clock signal will be affected.

SUMMARY OF THE INVENTION

In some aspects of the present disclosure, a quadrant alternate switching phase interpolator includes a first multiplexer circuit, a second multiplexer circuit, a phase interpolator circuitry, and a controller circuitry. The first multiplexer circuit is configured to output one of a first clock signal and a second clock signal to be a first signal in response to a first bit and a third bit in a quadrant control code, in which the first clock signal and the second clock signal are different in phase by 180 degrees. The second multiplexer circuit is configured to output one of a third clock signal and a fourth clock signal to be a second signal in response to a second bit and a fourth bit in the quadrant control code, in which the third clock signal and the fourth clock signal are different in phase by 180 degrees, and the first clock signal and the third clock signal are different in phase by 90 degrees. The phase interpolator circuitry is configured to generate an output clock signal in response to the first signal, the second signal, and a plurality of phase control bits. The controller circuitry is configured to output the quadrant control code and the plurality of phase control bits and perform a bit-shift operation on the plurality of phase control bits to adjust a phase of the output clock signal.

In some aspects of the present disclosure, a phase adjustment method includes the following operations: outputting a quadrant control code and a plurality of phase control bits, and performing a bit-shift operation on the plurality of phase control bits to adjust a phase of an output clock signal; outputting one of a first clock signal and a second clock signal to be a first signal in response to a first bit and a third bit in the quadrant control code, in which the first clock signal and the second clock signal are different in phase by 180 degrees; outputting one of a third clock signal and a fourth clock signal to be a second signal in response to a second bit and a fourth bit in the quadrant control code, in which the third clock signal and the fourth clock signal are different in phase by 180 degrees, and the first clock signal and the third clock signal are different in phase by 90 degrees; and generating the output clock signal in response to the first signal, the second signal, and the plurality of phase control bits.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
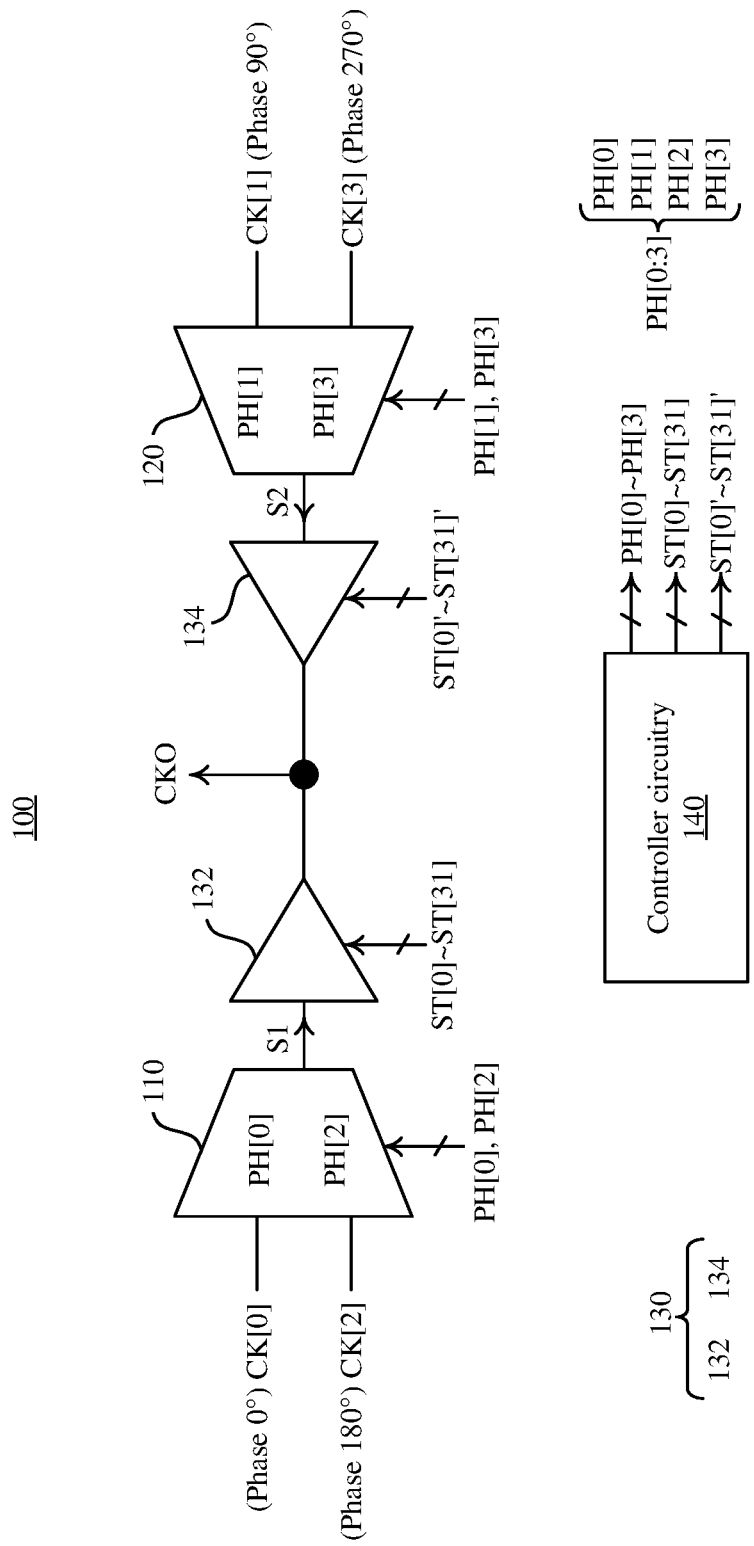
FIG. 1 illustrates a quadrant alternate switching phase interpolator 100 according to some embodiments of the present disclosure.

FIG. 1 illustrates a quadrant alternate switching phase interpolator 100 according to some embodiments of the present disclosure. The quadrant alternate switching phase interpolator 100 includes a multiplexer circuit 110, a multiplexer circuit 120, a phase interpolator circuitry 130, and a controller circuitry 140.

The multiplexer circuit 110 is configured to output one of a clock signal CK[0] and a clock signal CK[2] to be a signal S1 in response to a first bit PH[0] (hereinafter referred to as "bit PH[0]" for simplicity) and a third bit PH[2] (hereinafter referred to as "bit PH[2]" for simplicity) in a quadrant control code PH[0:3]. The multiplexer circuit 120 is configured to output one of a clock signal CK[1] and a clock signal CK[3] to be a signal S2 in response to a second bit PH[1] (hereinafter referred to as "bit PH[1]" for simplicity) and a fourth bit PH[3] (hereinafter referred to as "bit PH[3]" for simplicity) in the quadrant control code PH[0:3]. In some embodiments, the clock signal CK[0] and the clock signal CK[2] are different in phase by about 180 degrees, the clock signal CK[1] and the clock signal CK[3] are different in phase by about 180 degrees, and the clock signal CK[0] and the clock signal CK[1] are different in phase by about 90 degrees. For example, the phase of the clock signal CK[0] is about 0 degree, the phase of the clock signal CK[1] is about 90 degrees, the phase of the clock signal CK[2] is about 180 degrees, and the phase of the clock signal CK[3] is about 270 degrees.

With such arrangements, the signals S1 and S2 are alternately switched, in order to control the quadrant corresponding to the phase of an output clock signal CKO. For example, if the phase of the output clock signal CKO is in the first quadrant, the multiplexer circuit 110 may output the clock signal CK[0] to be the signal S1, and the multiplexer circuit 120 may output the clock signal CK[1] to be the signal S2. As a result, the phase of the output clock signal CKO will be between 0-90 degrees (corresponding to the first quadrant). If the phase of the output clock signal CKO is in the second quadrant, the multiplexer circuit 110 may switched to output the clock signal CK[2] to be the signal S1, and the multiplexer circuit 120 may keep outputting the clock signal CK[1] to be the signal S2. As a result, the phase of the output clock signal CKO will be between 90-180 degrees (corresponding to the second quadrant).

As mentioned below, based on the control of the controller circuitry 140, when the phase of the output clock signal CKO is switched from the current quadrant to a next quadrant, only one of the outputs of the multiplexer circuit 110 and the multiplexer circuit 120 (e.g., the signal S1 or the signal S2) is switched. As a result, jitters generated from phase switching can be lower, in order to increase the smoothness of quadrant switching. Operations regarding herein will be described with reference to FIG. 2.

The phase interpolator circuitry 130 is configured to generate the output clock signal CKO in response to the signal S1, the signal S2, and the phase control bits ST[0]-ST[31]. For example, the phase interpolator circuitry 130 includes a circuit portion 132 and a circuit portion 134. An output terminal of the circuit portion 132 is coupled to an output terminal of the circuit portion 134 to generate the output clock signal CKO. The circuit portion 132 generates the output clock signal CKO in response to the signal S1 and the phase control bits ST[0]-ST[31]. The circuit portion 134 generates the output clock signal CKO in response to the signal S2 and the phase control bits ST[0]'-ST[31]'. The phase control bits ST[0]-ST[31] and the phase control bits ST[0]'-ST[31]' have opposite logic values. For example, if the phase control bit ST[0] has a logic value of 0, the phase control bit ST[0]' has a logic value of 1. Alternatively, if the phase control bit ST[0] has the logic value of 1, the phase control bit ST[0]' has the logic value of 0.

Figure 2:
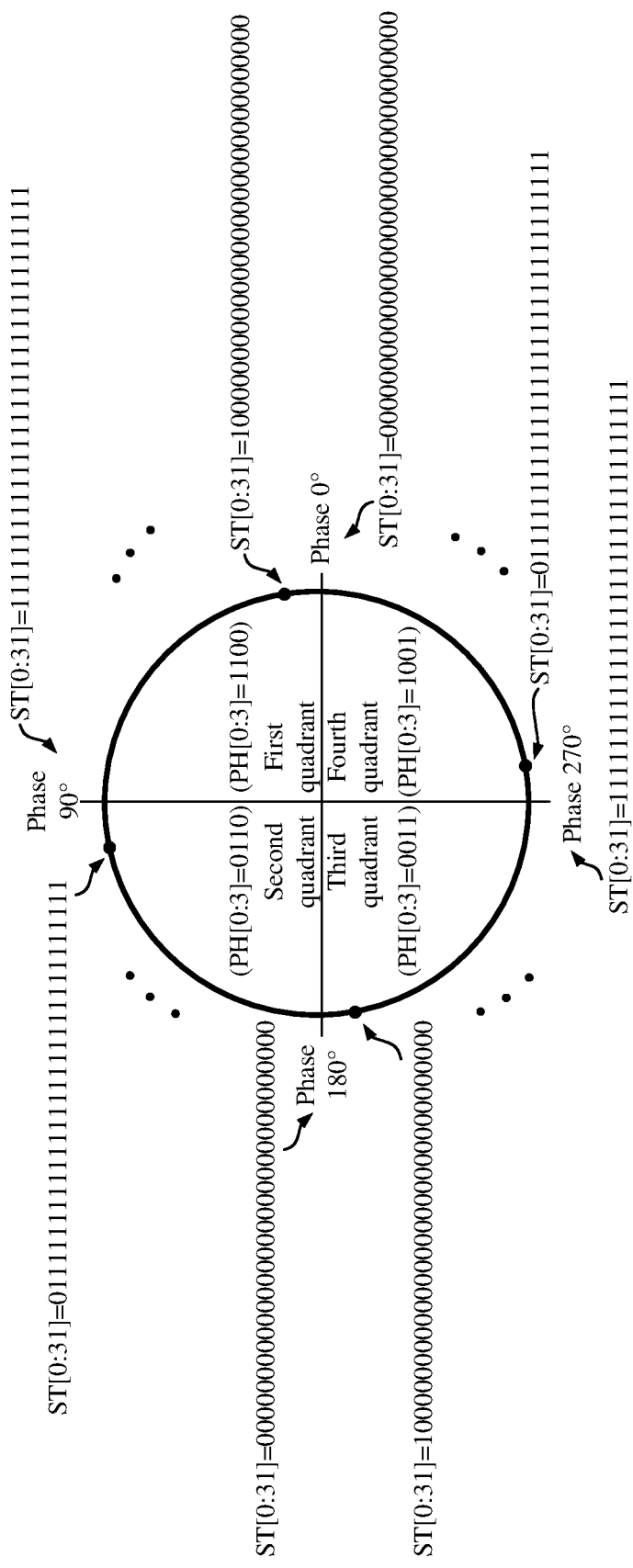
FIG. 2 illustrates a schematic diagram of corresponding relations among the phase of the output clock signal, the phase control bits, and the bits in the quadrant control code in FIG. 1 according to some embodiments of the present disclosure.

The controller circuitry 140 is configured to output the quadrant control code PH[0:3], the phase control bits ST[0]-ST[31], and the phase control bits ST[0]'-ST[31]'. In some embodiments, the controller circuitry 140 may be configured to perform a bit-shift operation on the phase control bits ST[0]-ST[31] (and/or the phase control bits ST[0]'-ST[31]'), in order to adjust the phase of the output clock signal CKO. In some embodiments, as shown in FIG. 2, the controller circuitry 140 may be sequentially switch each of the phase control bits ST[0]-ST[31] from a first logic value (e.g., the logic value of 0) to a second logic value (e.g., the logic value of 1), in order to adjust the phase of the output clock signal CKO. Similarly, the controller circuitry 140 may be configured to perform a bit-shift operation on the bits PH[0]-PH[3] in the quadrant control code PH[0:3], in order to switch the phase of the output clock signal CKO from the current quadrant to a next quadrant.

Compared with a general phase interpolator that does not employ quadrant switching, the number of phase control bits employed by the quadrant alternate switching phase interpolator 100 can be lower. For example, in order to adjust 128 phases, the quadrant alternate switching phase interpolator 100 may utilize 31 phase control bits for switching, and the generate phase interpolator that does not employ the quadrant switching requires employing 128 phase control bits for switching. As a result, the complexity of the hardware of the controller circuitry 140 can be reduced, in order to have higher phase updating rate.

FIG. 2 illustrates a schematic diagram of corresponding relations among the phase of the output clock signal CKO, the phase control bits ST[0]-ST[31], and the bits PH[0]-PH[3] in the quadrant control code PH[0:3] in FIG. 1 according to some embodiments of the present disclosure.

As shown in FIG. 2, the phase of the output clock signal CKO may be divided into four quadrants. When the quadrant control code PH[0:3] is 1100 (i.e., the bit PH[0] and the bit PH[1] are logic values of 1, and the bit PH[2] and the bit PH[3] are logic values of 0), the phase of the output clock signal CKO is in the first quadrant. In the first quadrant, the phase of the output clock signal CKO may be 0-90 degrees. Under this condition, when each of the phase control bits ST[0]-ST[31] (labeled as ST[0:31]) is the logic value of 0, the phase of the output clock signal CKO is about 0 degree. When each of the phase control bits ST[0]-ST[31] is the logic value of 1, the phase of the output clock signal CKO is about 90 degrees.

When the quadrant control code PH[0:3] is 1100, the controller circuitry 140 may sequentially switch the phase control bits ST[0]-ST[31] (labeled as ST[0:31]) from the logic values of 0 to the logic values of 1, in order to adjust the phase of the output clock signal CKO from about 0 degree to about 90 degrees. For example, starting from a first phase control bit ST[0] in the phase control bits ST[0]-ST[31], the controller circuitry 140 may sequentially update the phase control bits ST[0]-ST[31] to be logic values of 1. In other words, the controller circuitry 140 may sequentially shift logic values of 1 from the first phase control bit ST[0] to the last phase control bit ST[31] (i.e., the aforementioned bit-shift operation), until each of the phase control bits ST[0]-ST[31] has the logic value of 1. During the above switching progress, the phase of the output clock signal CKO is gradually adjusted from about 0 degree to about 90 degrees. Alternatively, the controller circuitry 140 may sequentially shift logic values of 0 from the last phase control bit ST[31] to the first phase control bit ST[0] (i.e., the aforementioned bit-shift operation), until each of the phase control bits ST[0]-ST[31] has the logic values of 0. During the above switching, the phase of the output clock signal CKO is gradually adjusted from about 90 degrees to about 0 degree.

When the quadrant control code PH[0:3] is 0110 (i.e., the bit PH[1] and the bit PH[2] are logic values of 1, and the bit PH[0] and the bit PH[3] are logic values of 0), the phase of the output clock signal CKO is in the second quadrant. In the second quadrant, the phase of the output clock signal CKO is 90-180 degrees. Under this condition, when each of the phase control bits ST[0]-ST[31] is the logic value of 0, the phase of the output clock signal CKO is about 180 degrees. Similarly, the controller circuitry 140 may sequentially switch the phase control bits ST[0]-ST[31] from the logic values of 1 to the logic values of 0, in order to adjust the phase of the output clock signal CKO from about 90 degrees to about 180 degrees. For example, starting from the first phase control bit ST[0] in the phase control bits ST[0]-ST[31], the controller circuitry 140 may sequentially update the phase control bits ST[0]-ST[31] to be logic values of 0. In other words, the controller circuitry 140 may sequentially shift the logic values of 0 from the first phase control bit ST[0] to the last phase control bit ST[31] (i.e., the aforementioned bit-shift operation), until each of the phase control bits ST[0]-ST[31] has the logic values of 0. In the above switching progress, the phase of the output clock signal CKO is gradually adjusted from about 90 degrees to about 180 degrees. Alternatively, the controller circuitry 140 may sequentially shifts logic values of 1 from the last phase control bit ST[31] to the first phase control bit ST[0] (i.e., the aforementioned bit-shift operation), until each of the phase control bits ST[0]-ST[31] has the logic value of 1. In the above switching progress, the phase of the output clock signal CKO is gradually adjusted from about 180 degrees to about 90 degrees.

When the quadrant control code PH[0:3] is 0011 (i.e., the bit PH[0] and the bit PH[1] are logic values of 1, and the bit PH[2] and the bit PH[3] are logic values of 0), the phase of the output clock signal CKO is in the third quadrant. In the third quadrant, the phase of the output clock signal CKO is about 180-270 degrees. Under this condition, when each of the phase control bits ST[0]-ST[31] has the logic value of 1, the phase of the output clock signal CKO is about 270 degrees. Based on the similar operations, the controller circuitry 140 may sequentially switch the phase control bits ST[0]-ST[31] from logic values of 0 to logic values of 1, in order to adjust the phase of the output clock signal CKO from about 180 degrees to about 270 degrees. Alternatively, the controller circuitry 140 may sequentially switch the phase control bits ST[0]-ST[31] from logic values to logic values of 0, in order to adjust the phase of the output clock signal CKO from about 270 degrees to 180 degrees.

When the quadrant control code PH[0:3] is 1001 (i.e., the bit PH[0] and the bit PH[3] are logic values of 1, and the bit PH[1] and the bit PH[2] are logic values of 0), the phase of the output clock signal CKO is in the fourth quadrant. In the fourth quadrant, the phase of the output clock signal CKO is about 270-360 degrees (in which 360 degrees is the same as 0 degree). Under this condition, when each of the phase control bits ST[0]-ST[31] has the logic value of 9, the phase of the output clock signal CKO is about 0 degree. Based on the similar operations, the controller circuitry 140 may sequentially switch the phase control bits ST[0]-ST[31] from logic values of 1 to logic values of 0, in order to adjust the phase of the output clock signal CKO from about 270 degree to about 0 degree. Alternatively, the controller circuitry 140 may sequentially switch the phase control bits ST[0]-ST[31] from logic values of 0 to logic values of 1, in order to adjust the phase of the output clock signal CKO from about 0 degree to about 270 degrees.

Based on FIG. 2, it can be understood that the controller circuitry 140 may be configured to perform the bit-shift operation on the quadrant control code PH[0:3], in order to switch the phase of the output clock signal CKO from a current quadrant to a next quadrant. In one bit-shift operation, a number of bits being changed in the bits PH[0]-PH[3] is two. For example, the controller circuitry 140 may perform a right shift operation on the bits PH[0]-PH[3], in order to switch the quadrant control code PH[0:3] from 1100 to 0110. As a result, the phase of the output clock signal CKO may be switched from the first quadrant to the second quadrant, in which the bit PH[0] and the bit PH[2] are changed, and the bit PH[1] and the bit PH[3] are unchanged. In other words, in this switching progress, the multiplexer circuit 110 in FIG. 1 is switched to output the clock signal CK[2] to be the signal S1 in response to the bit PH[0] and the bit PH[2], and the multiplexer circuit 120 keeps outputting the clock signal CK[1] to be the signal S2 in response to the bit PH[1] and the bit PH[3]. As a result, only one output of the multiplexer circuit is switched, which results in lower jitter(s) generated from the switching progress, in order to improve the smoothness of quadrant switching.

Similarly, based on FIG. 2, it may be understood that the controller circuitry 140 may perform the bit-shift operation on the phase control bits ST[0]-ST[31], in order to adjust the phase of the output clock signal CKO. In one bit-shift operation, the number of bits being changed in the phase control bits ST[0]-ST[31] is one. For example, the controller circuitry 140 may adjust the phase control bits ST[0]-ST[31] from 000 . . . 000 to 100 . . . 000, in which only the bit ST[0] is changed. As a result, the number of times of circuits in the phase interpolator circuitry 130 being switched can be lower, in order to increase the speed and the smoothness of phase switching. The number of bits being changed in one bit-shift operation is given for illustrative purposes, and the present disclosure is not limited thereto. The number of bits being changed may be adjusted according to different practical requirements.

Figure 3A:
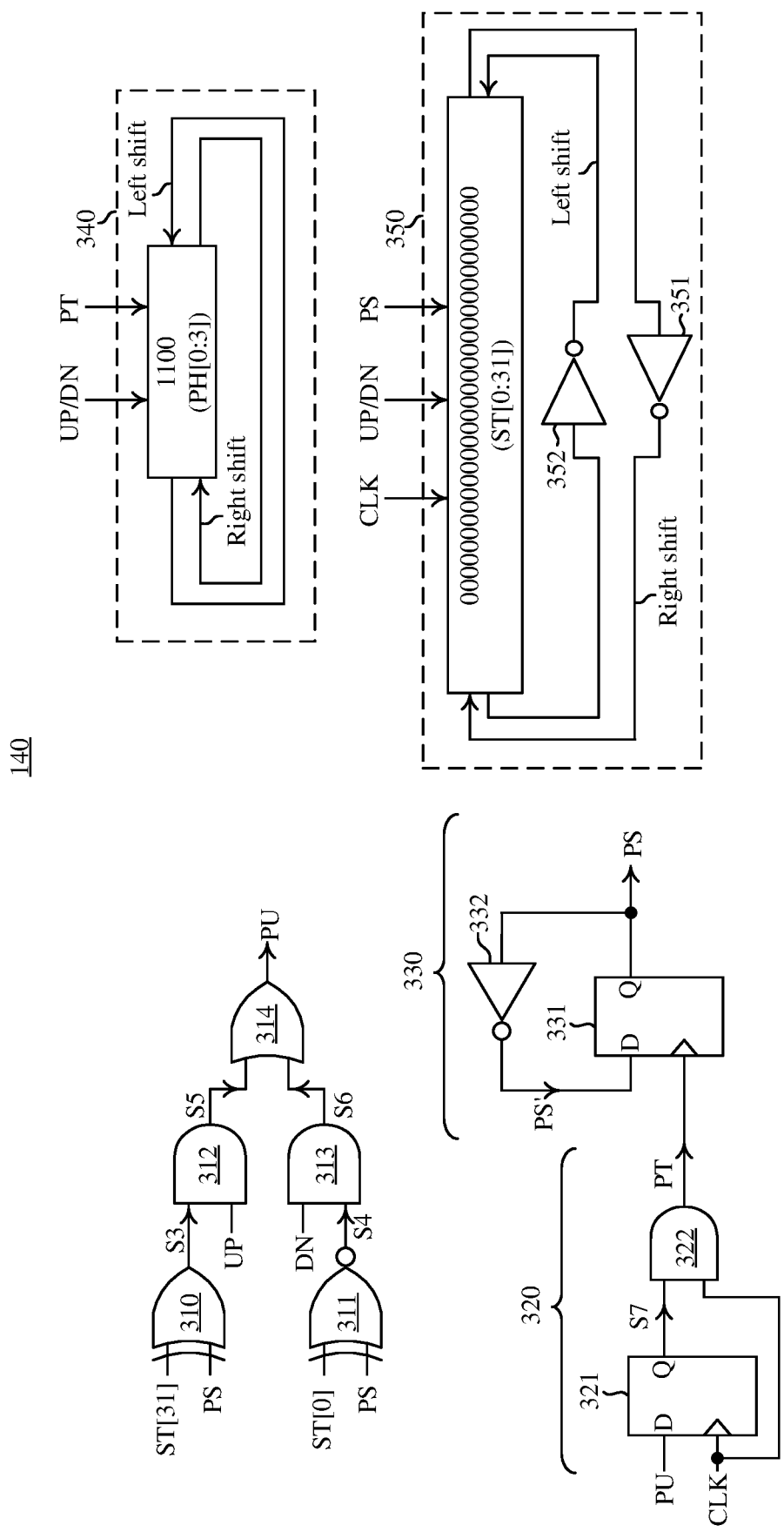
FIG. 3A illustrates a schematic diagram of the controller circuitry in FIG. 1 according to some embodiments of the present disclosure.

FIG. 3A illustrates a schematic diagram of the controller circuitry 140 in FIG. 1 according to some embodiments of the present disclosure. The controller circuitry 140 includes logic gate circuits 310-314, an interval adjustment circuit 320, a state prediction circuit 330, a shift register circuit 340, and a shift register circuit 350. The logic gate circuits 310-314 may be configured to generate an update signal PU according to a state signal PS, the first phase control bit ST[0] and the last phase control bit ST[31] in the phase control bits ST[0]-ST[31], a phase adjustment signal UP, and a phase adjustment signal DN. The state signal PS is configured to indicate a current quadrant corresponding to the phase of the output clock signal CKO. The phase adjustment signal UP is configured to indicate that the phase of the output clock signal CKO is adjusted in a counterclockwise direction shown in FIG. 2. The phase adjustment signal DN is configured to indicate that the phase of the output clock signal CKO is adjusted in a clockwise direction shown in FIG. 2. In some embodiments, the phase adjustment signals UP and DN have opposite logic values.

In greater detail, the logic gate circuit 310 is configured to generate a signal S3 according to the last phase control bit ST[31] and the state signal PS. In some embodiments, the logic gate circuit 310 may be a XOR gate circuit. The logic gate circuit 311 is configured to generate a signal S4 according to the first phase control bit ST[0] and the state signal PS. In some embodiments, the logic gate circuit 311 may be a XNOR gate circuit. The logic gate circuit 312 is configured to generate a signal S5 according to the signal S3 and the phase adjustment signal UP. The logic gate circuit 313 is configured to generate a signal S6 according to the signal S4 and the phase adjustment signal DN. In some embodiments, each of the logic gate circuits 312 and 313 may be an AND gate circuit. The logic gate circuit 314 is configured to generate the update signal PU according to the signals S5 and S6. In some embodiments, the logic gate circuit 314 may be a OR gate circuit. The types of the logic gate circuits 310-314 are given for illustrative purposes, and the present disclosure is not limited thereto. Various logic gates able to implement similar operations are within the contemplated scope of the present disclosure.

The interval adjustment circuit 320 is configured to generate a shift trigger signal PT according to a clock signal CLK and the update signal PU. In some embodiments, the interval adjustment circuit 320 is to generate the shift trigger signal PT having a predetermined interval, in which the predetermined interval is a half of an active interval of the phase adjustment signal UP (or the phase adjustment signal DN). As a result, the state prediction circuit 330 may be triggered according to a transiting edge (e.g., a rising edge) of the shift trigger signal PT during the active interval, in order to update the state signal PS. In some embodiments, the interval adjustment circuit 320 includes a flip flop circuit 321 and a logic gate circuit 322. The flip flop circuit 321 is configured to output the update signal to be a signal S7 according to the clock signal CLK. The logic gate circuit 322 is configured to generate the shift trigger signal PT according to the signal S7 and the clock signal CLK. In some embodiments, the flip flop circuit 321 may be a D type flip flop circuit, and the logic gate circuit 322 may be a AND gate circuit, but the present disclosure is not limited thereto.

The state prediction circuit 330 is configured to update the state signal PS according to the shift trigger signal PT. The state prediction circuit 330 may predict the quadrant switching direction of the phase of the output clock signal CKO before that phase is switched from the current quadrant to the next quadrant. In greater detail, the state prediction circuit 330 includes a flip flop circuit 331 and an inverter circuit 332. The flip flop circuit 331 is configured to output a state signal PS' to be the state signal PS according to the shift trigger signal PT. The inverter circuit 332 is configured to output the state signal PS' according to the state signal PS. In some embodiments, the flip flop circuit 331 may be a D type flip flop circuit, but the present disclosure is not limited thereto.

In this example, if the current phase corresponds to the first quadrant or the third quadrant in FIG. 2, the state signal PS is the logic value of 0. If the current phase corresponds to the second quadrant or the fourth quadrant in FIG. 2, the state signal PS is the logic value of 1. As the first quadrant to the fourth quadrant are successive quadrants, when the phase of the output clock signal CKO is switched from the first quadrant (or the third quadrant) to the second quadrant or the fourth quadrant, the state signal PS is switched from the logic value of 0 to the logic value of 1. Similarly, when the phase of the output clock signal CKO is switched from the second quadrant (or the fourth quadrant) to the first quadrant or the third quadrant, the state signal PS is switched from the logic value of 0 to the logic value of 1. In other words, the inverter circuit 332 may generate the state signal PS' that corresponds to the next quadrant in advance according to the current state signal PS, in order to update the state signal PS. Equivalently speaking, before a next quadrant switching, the controller circuitry 140 is able to predict the direction of quadrant switching with the state signal PS and the inverter circuit 332.

The shift register circuit 340 is configured to store the quadrant control code PH[0:3]. In some embodiments, the shift register circuit 340 may perform the bit-shift operation on the quadrant control code PH[0:3] according to the shift trigger signal PT and at least one of the phase adjustments UP and DN. If the phase adjustment signal DN has the logic value of 1 (i.e., the phase adjustment signal DN has the logic value of 0), it indicates that the phase of the output clock signal CKO is adjusted in the counterclockwise direction. Under this condition, the shift register circuit 340 may perform the right shift operation on the quadrant control bits PH[0]-PH[3] when the shift trigger signal PT having a predetermined level. Alternatively, if the phase adjustment signal DN has the logic value of 1 (i.e., the phase adjustment signal UP has the logic value of 0), it indicates that the phase of the output clock signal CKO is adjusted in the clockwise direction. Under this condition, the shift register circuit 340 nay perform the left shift operation on the quadrant control code PH[0:3] when the shift trigger signal PT having the predetermined level. In some embodiments, the shift register circuit 340 may perform the bit-shift operation according to the shift trigger signal PT and a signal that is associated with at least one of the phase adjustment signals UP and DN (e.g., the signal S5 and/or the signal S6), but the present disclosure is not limited thereto.

The shift register circuit 350 is configured to store the phase control bits ST[0]-ST[31]. In some embodiments, the shift register circuit 350 may perform the bit-shift operation on the phase control bits ST[0]-ST[31] according to the state signal PS, the clock signal CLK, and at least one of the phase adjustment signals UP and DN, in order to adjust the phase control bits ST[0]-ST[31]. In this example, each of the phase control bits ST[0]-ST[31] is preset to the logic value of 0. If the phase adjustment signal UP has the logic value of 1 and the state signal PS has the logic value of 1, it indicates that the phase of the output clock signal CKO is adjusted in the counterclockwise direction and the current quadrant is the first quadrant or the third quadrant. Under this condition, the shift register circuit 350 is triggered by the clock signal CLK to sequentially shift logic values of 1 from the first phase control bit ST[0] to the last phase control bit ST[31] with the internal inverter circuit 351, in order to gradually adjust the phase control bits ST[0]-ST[31]. Alternatively, if the phase adjustment signal UP has the logic value of 0 and the state signal PS has the logic value of 1, it indicates that the phase of the output clock signal CKO is adjusted in the clockwise direction and the current quadrant is the first quadrant or the third quadrant. Under this condition, the shift register circuit 350 is triggered by the clock signal CLK to sequentially shift logic values of 0 from the last phase control bit ST[31] to the first phase control bit ST[0] with the internal inverter circuit 352, in order to gradually adjust the phase control bits ST[0]-ST[31]. Operations of other quadrants can be understood with this analogy, and thus the repetitious descriptions are not further given.

Figure 3B:
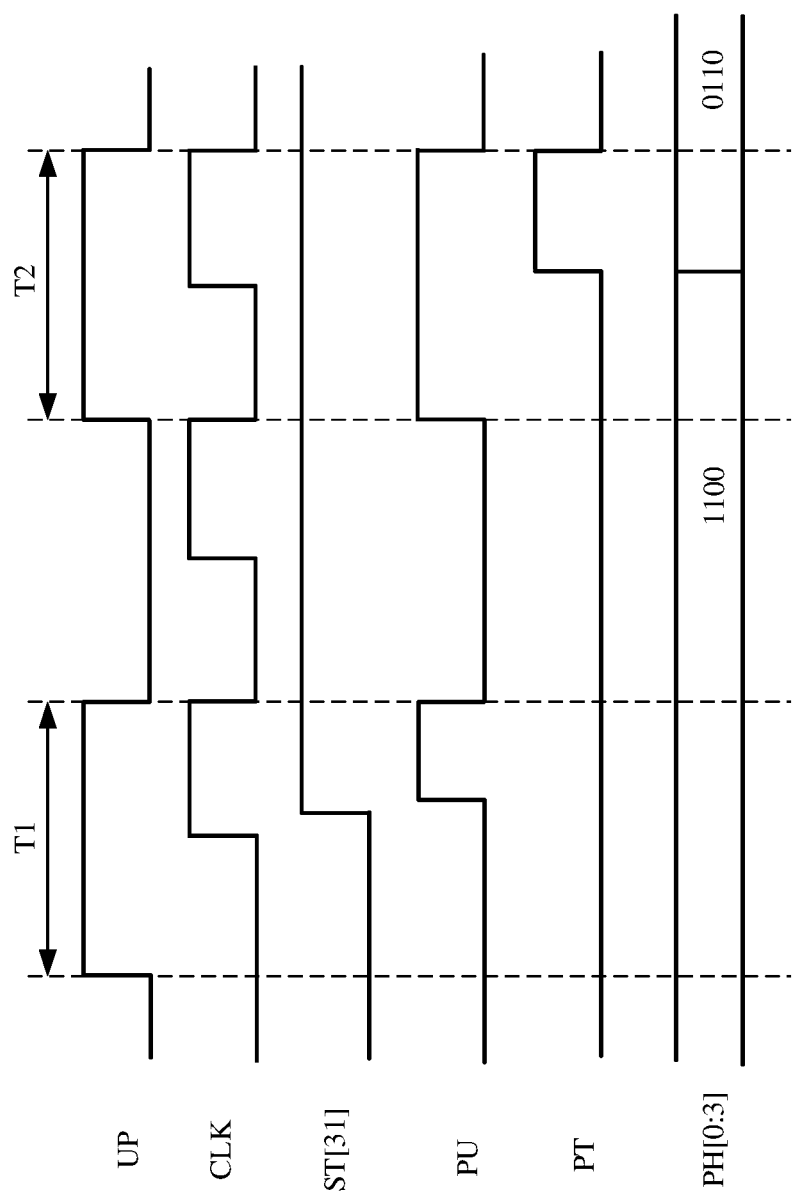
FIG. 3B illustrates a timing diagram of certain signals in FIG. 3A according to some embodiments of the present disclosure.

FIG. 3B illustrates a timing diagram of certain signals in FIG. 3A according to some embodiments of the present disclosure. In this example, the phase of the output clock signal CKO is in the first quadrant, and thus the quadrant control code PH[0:3] is 1100 and the state signal PS (not shown) has the logic value of 0. During an active interval T1 of the phase adjustment signal UP, the last phase control bit ST[31] has the logic value of 1. Under this condition, it indicates that the phase of the output clock signal CKO is about 90 degrees and is going to enter the second quadrant. In response to the state signal UP and the last phase control bit ST[31], the logic gate circuit 310 outputs the signal S3 having the logic value of 1 (which corresponds to a high level), such that the logic gate circuit 314 outputs the update signal PU having the high level. During an active interval T2 of the phase adjustment signal UP, the interval adjustment circuit 320 outputs the shift trigger signal PT having the high level in response to the clock signal CLK having a high level. In response to this shift trigger signal PT, the shift register circuit 340 may perform the bit-shift operation on the quadrant control code PH[0:3], in order to adjust the phase of the output clock signal CKO to the second quadrant. Moreover, in response to the shift trigger signal PT, the state prediction circuit 330 may update the state signal PS (not shown) to the logic value of 1.

Figure 4A:
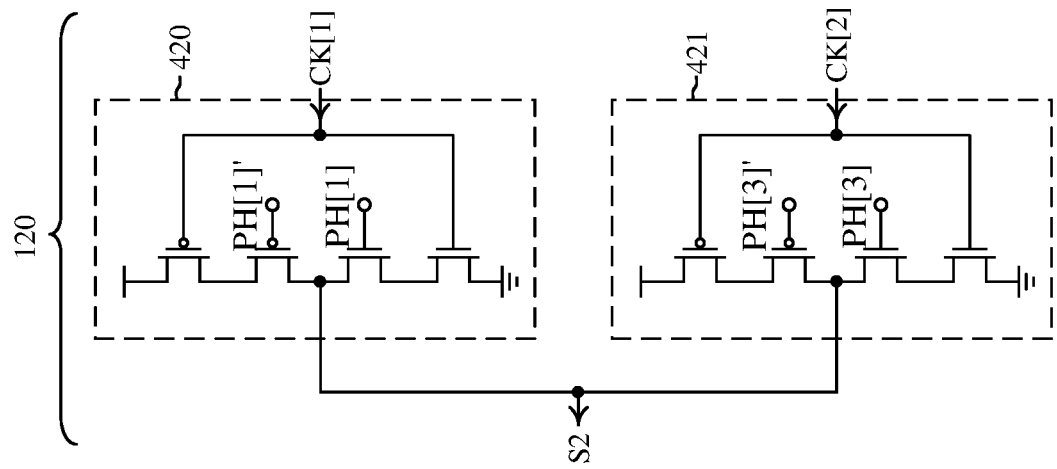
FIG. 4A illustrates a schematic diagram of the multiplexer circuits in FIG. 1 according to some embodiments of the present disclosure.
Figure 4A:
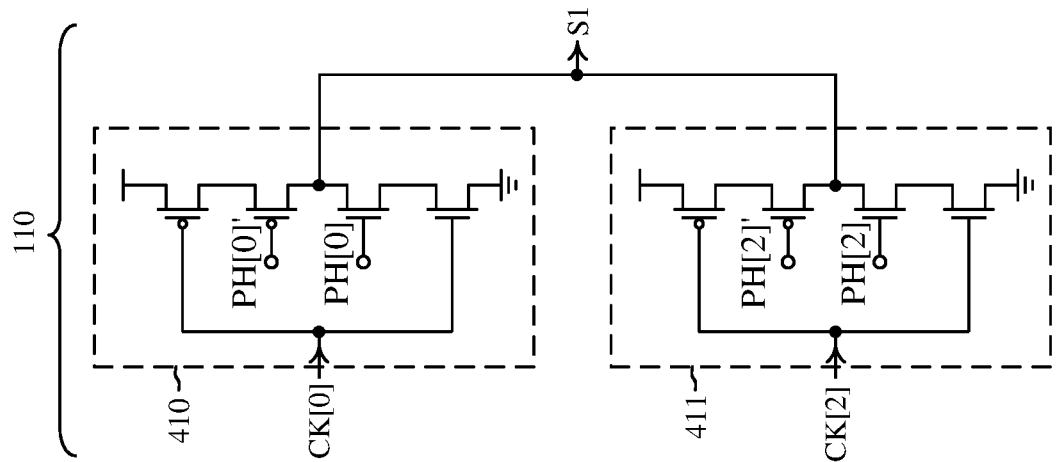

FIG. 4A illustrates a schematic diagram of the multiplexer circuit 110 and the multiplexer circuit 120 in FIG. 1 according to some embodiments of the present disclosure. In some embodiments, each of the multiplexer circuit 110, the multiplexer circuit 120, and the phase interpolator circuitry 130 may be an inverter-based digital circuit. Compared with employing current mode logic circuits, such arrangements are able to reduce the number of circuits, circuit area, and parasitic capacitances, and to prevent the output clock signal CKO from being affected by jitters on the DC common mode signal. Accordingly, the power consumption and the circuit area the quadrant alternate switching phase interpolator 100 can be reduced while the bandwidth of the multiplexer circuit 110 and the multiplexer circuit 120 can be increased.

In greater detail, the multiplexer circuit 110 includes an inverter circuit 410 and an inverter circuit 411. An output terminal of each of the inverter circuits 410 and 411 is coupled with each other to output the signal S1. The inverter circuit 410 is configured to be enabled according to the bit PH[0] and a bit PH[0]', in order to output the signal S1 according to the clock signal CK[0]. The inverter circuit 411 is configured to be enabled according to the bit PH[2] and a bit PH[2]', in order to generate the signal S1 according to the clock signal CK[2]. Similarly, the multiplexer circuit 120 includes an inverter circuit 420 and an inverter circuit 421. An output terminal of each of the inverter circuits 420 and 421 is coupled with each other, in order to output the signal S2. The inverter circuit 420 is configured to be enabled according to the bit PH[1] and a bit PH[1]', in order to output the signal S2 according to the clock signal CK[1]. The inverter circuit 421 is configured to be enabled according to the bit PH[3] and a bit PH[3]', in order to output the signal S3 according to the clock signal CK[3]. A corresponding one of the bits PH[0]-PH[3] and a corresponding one of the bits PH[0]'-PH[3]' have opposite logic values. For example, when the bit PH[0] has the logic value of 1, the bit PH[0]' has the logic value of 0, and vice versa.

Figure 4B:
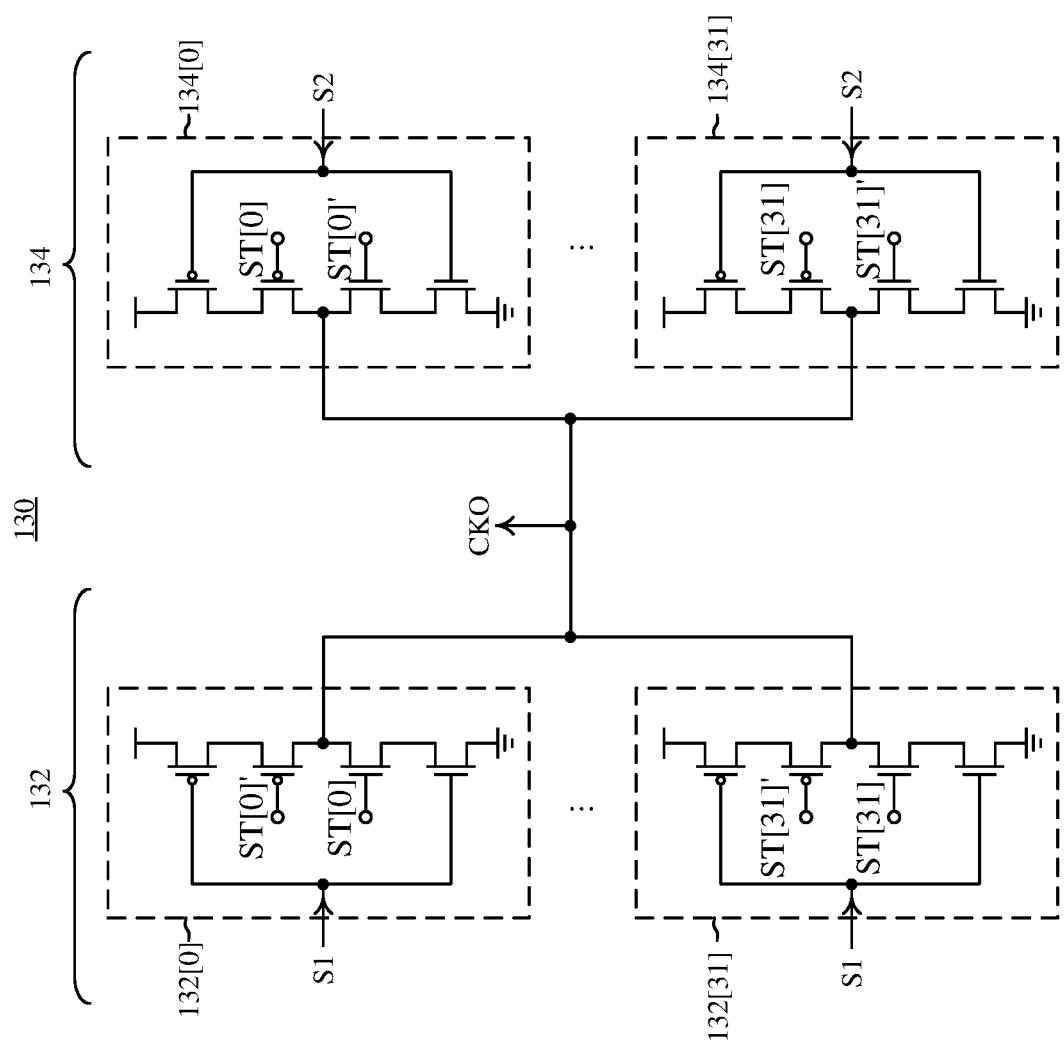
FIG. 4B illustrates the phase interpolator circuitry in FIG. 1 according to some embodiments of the present disclosure.

FIG. 4B illustrates the phase interpolator circuitry 130 in FIG. 1 according to some embodiments of the present disclosure. The circuit portion 132 includes inverter circuits 132[0]-132[31], and the circuit portion 134 includes inverter circuits 134[0]-134[31]. Output terminals of the inverter circuits 132[0]-132[31] and 134[0]-134[31] are coupled together, in order to generate the output clock signal CKO.

Each of the inverter circuits 132[0]-132[31] is configured to be enable according to a corresponding one of the phase control bits ST[0]-ST[31] and a corresponding one of the phase control bits ST[0]'-ST[31]', in order to generate the output clock signal CKO according to the signal S1. For example, the inverter circuit 132[0] is enabled according to the phase control bits ST[0] and ST[0]', in order to generate the output clock signal CKO. With this analogy, the inverter circuit 132[31] is enabled according to the phase control bits ST[31] and ST[31]', in order to generate the output clock signal CKO.

Similarly, each of the inverter circuits 134[0]~134[31] is enabled according to a corresponding one of the phase control bits ST[0]'-ST[31]' and a corresponding one of the phase control bits ST[0]-ST[31], in order to generate the output clock signal CKO according to the signal S2. For example, the inverter circuit 134[0] is enabled according to the phase control bits ST[0]' and ST[0], in order to generate the output clock signal CKO. With this analogy, the inverter circuit 134[3] is enabled according to the phase control bits ST[31]' and ST[31], in order to generate the output clock signal CKO.

Figure 5:
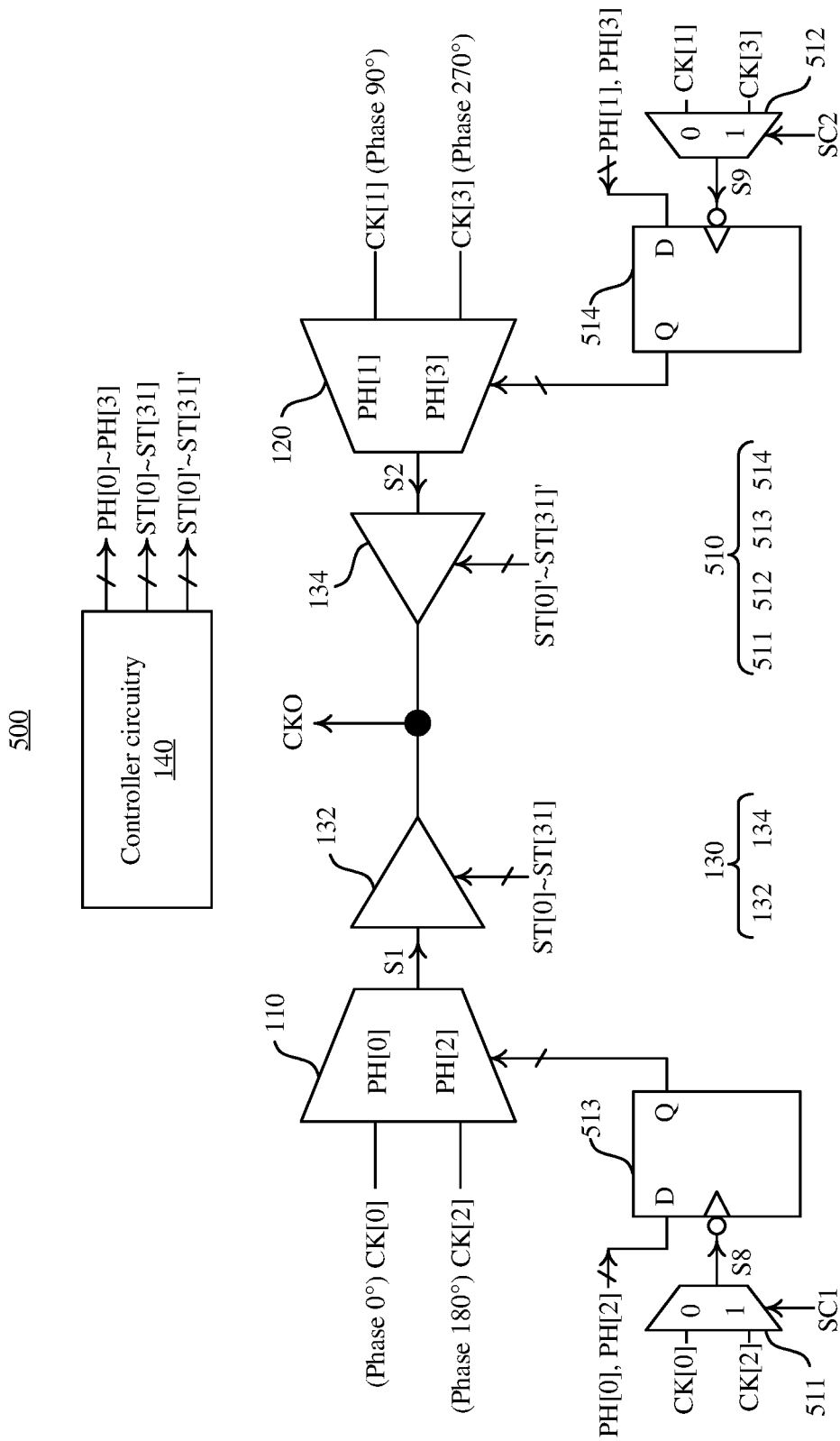
FIG. 5 illustrates a schematic diagram of a quadrant alternate switching phase interpolator according to some embodiments of the present disclosure.

FIG. 5 illustrates a schematic diagram of a quadrant alternate switching phase interpolator 500 according to some embodiments of the present disclosure. Compared with FIG. 1, in this example, the quadrant alternate switching phase interpolator 500 further includes a synchronous circuit 510. The synchronous circuit 510 may be configured to output the bit PH[0] and the bit PH[2] to the multiplexer circuit 110 according to a first synchronous signal S8 and output the bit PH[1] and the bit PH[3] to the multiplexer circuit 120 a second synchronous signal S9. The first synchronous signal S8 or the second synchronous signal S9 is a signal having a phase that leads the current phase of the output clock signal CKO by about 90 degrees before the phase of the output clock signal CKO is switched.

With synchronous circuit 510, the clock signals CK[0]-CK[3] may be synchronized with operations of the controller circuitry 140. As a result, the incorrect waveform change(s) on the signal S1 (or the signal S2) under certain conditions (for example, the time point of quadrant switching is close to the rising edge of the output clock signal CKO) can be avoided.

In greater detail, the synchronous circuit 510 includes a multiplexer circuit 511, a multiplexer circuit 512, a latch circuit 513, and a latch circuit 514. The multiplexer circuit 511 is configured to output one of the clock signal CK[0] and the clock signal CK[2] to be the first synchronous signal S8 according to a switching signal SC1. If the phase of the output clock signal CKO is in the first quadrant or the second quadrant, the switching signal SC1 has the logic value of 0. If the phase of the output clock signal CKO is in the third quadrant or the fourth quadrant, the switching signal SC1 has the logic value of 1. The multiplexer circuit 512 is configured to output one of the clock signal CK[1] and the clock signal CK[3] to be the second synchronous signal S9 according to a switching signal SC2. If the phase of the output clock signal CKO is in the second quadrant or the third quadrant, the switching signal SC2 has the logic value of 0. If the phase of the output clock signal CKO is in the first quadrant or the fourth quadrant, the switching signal SC2 has the logic value of 1.

The latch circuit 513 is configured to output the bit PH[0] and the bit PH[2] to the multiplexer circuit 110 according to the first synchronous signal S8, which is inputted to an inverting input terminal of the latch circuit 513. The latch circuit 514 is configured to the bit PH[1] and the bit PH[3] to the multiplexer circuit 120 according to the second synchronous signal S9, which is inputted to an inverting input terminal of the latch circuit 514.

For example, if the phase is going to be switched from the first quadrant to the second quadrant, it indicates that the current phase of the output clock signal CKO is about 90 degrees. Under this condition, the multiplexer circuit 511 selects the clock signal CK[0] (i.e., a signal having a phase that leads the phase of the output clock signal CKO by 90 degrees) to be the first synchronous signal S8, and the transmits the first synchronous signal S8 to the inverting input terminal of the latch circuit 513. As a result, the multiplexer circuit 110 may be switched at a specific time point in response to the bit PH[0] and the bit PH[2], and that specific time point is not a time point which is different from (i.e., lead or lag) the current phase of the output clock signal CKO by about 90 degrees. In other words, in this example, the multiplexer circuit 110 will not be switched at the time point, which is different from the current phase of the output clock signal CKO by about 90 degrees.

Alternatively, if the phase is going to be switched from the second quadrant to the third quadrant, it indicates that the current phase of the output clock signal CKO is about 180 degrees. Under this condition, the multiplexer circuit 512 selects the clock signal CK[1] (i.e., the signal having a phase that leads the phase of the output clock signal CKO by about 90 degrees) to be the second synchronous signal S9 and transmits the second synchronous signal S9 to the inverting input terminal of the latch circuit 514. As a result, the multiplexer circuit 120 may be switched at a specific time point in response to the bit PH[1] and the bit PH[3], and that specific time point is not a time point which is different from (i.e., lead or lag) the current phase of the output clock signal CKO by about 90 degrees. In other words, in this example, the multiplexer circuit 120 will not be switched at the time point, which is different from the current phase of the output clock signal CKO by about 90 degrees.

The above arrangements of the synchronous circuit 510 are given for illustrative purposes, and the present disclosure is not limited thereto. Various synchronous circuits 510 able to increase the accuracy of the signal waveform are within the contemplated scope of the present disclosure.

Figure 6:
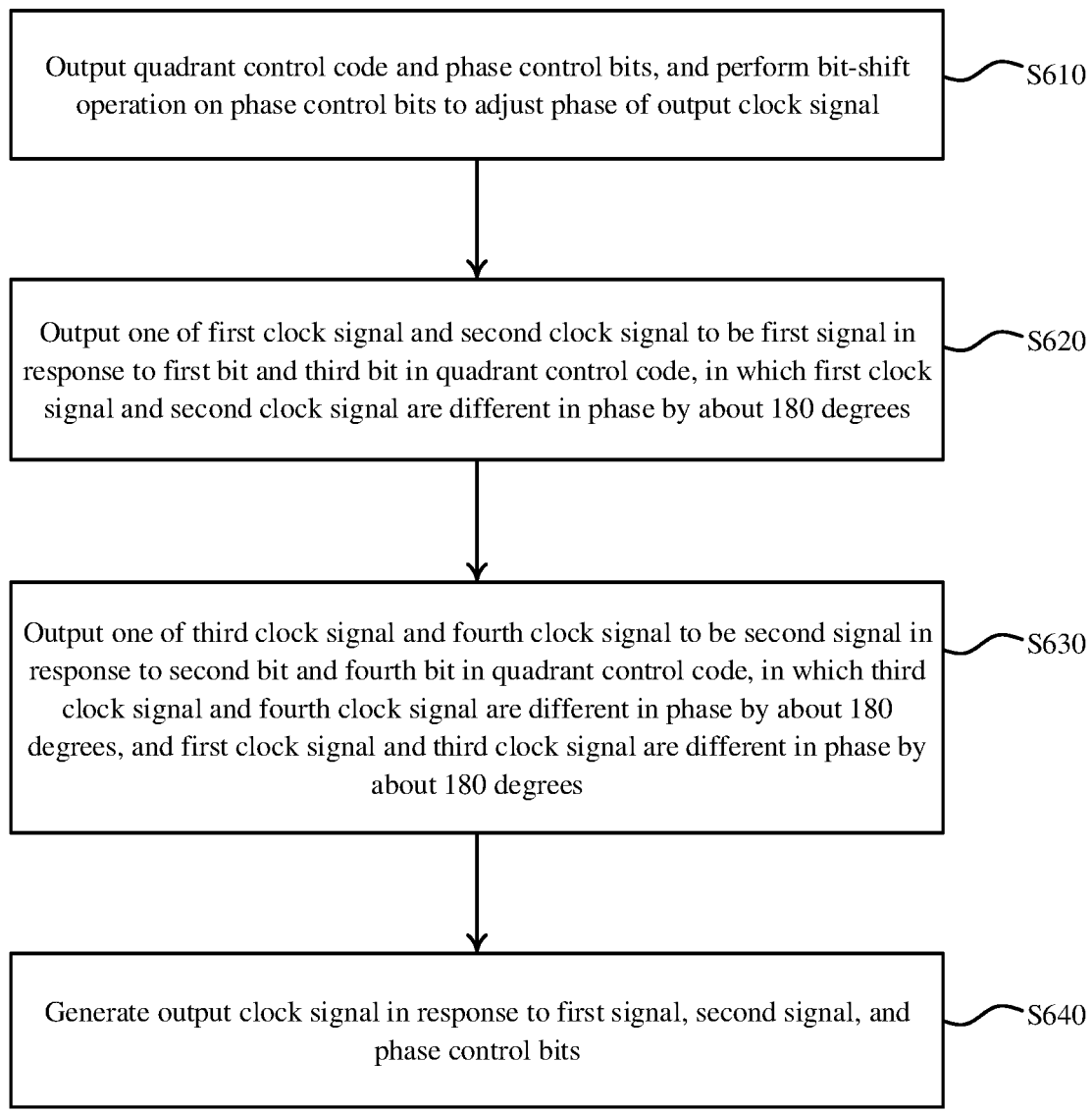
FIG. 6 illustrates a flow chart of a phase adjustment method according to some embodiments of the present disclosure.

FIG. 6 illustrates a flow chart of a phase adjustment method 600 according to some embodiments of the present disclosure. In operation S610, the quadrant control code and the phase control bits are outputted, and a bit-shift operation is performed on the phase control bits to adjust the phase of the output clock signal. In operation S620, one of the first clock signal and the second clock signal is outputted to be a first signal in response to the first bit and the third bit in the quadrant control code, in which the first clock signal and the second clock signal are different in phase by about 180 degrees. In operation S630, one of the third clock signal and the fourth clock signal is outputted to be a first signal in response to the second bit and the fourth bit in the quadrant control code, in which the third clock signal and the fourth clock signal are different in phase by about 180 degrees, and the first clock signal and the third clock signal are different in phase by about 90 degrees. In operation S640, the output clock signal is generated in response to the first signal, the second signal, and the phase control bits.

The above operations can be understood with reference to above embodiments, and thus the repetitious descriptions are not further given. The above description of the phase adjustment method 600 includes exemplary operations, but the operations of the phase adjustment method 600 are not necessarily performed in the order described above. Operations of the phase adjustment method 600 can be added, replaced, changed order, and/or eliminated, or the operations of the phase adjustment method 600 can be executed simultaneously or partially simultaneously as appropriate, in accordance with the spirit and scope of various embodiments of the present disclosure.

As described above, the quadrant alternate switching interpolator and the phase adjustment method in some embodiments of the present disclosure may utilize two two-to-one multiplexer circuits to alternately switch the quadrant and may adjust the phase with a bit-shift operation. Moreover, the multiplexer circuit and the interpolator circuit may be implemented with inverter-based digital circuit. Accordingly, the circuit area and the power consumption can be lower, and the bandwidth of the multiplexer circuit can be higher. As a result, the quadrant alternate switching is more suitable for high-speed applications.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A quadrant alternate switching phase interpolator, comprising:
   a first multiplexer circuit configured to output one of a first clock signal and a second clock signal to be a first signal in response to a first bit and a third bit in a quadrant control code, wherein the first clock signal and the second clock signal are different in phase by 180 degrees;
   a second multiplexer circuit configured to output one of a third clock signal and a fourth clock signal to be a second signal in response to a second bit and a fourth bit in the quadrant control code, wherein the third clock signal and the fourth clock signal are different in phase by 180 degrees, and the first clock signal and the third clock signal are different in phase by 90 degrees;
a phase interpolator circuitry configured to generate an output clock signal in response to the first signal, the second signal, and a plurality of phase control bits; and
a controller circuitry configured to output the quadrant control code and the plurality of phase control bits and perform a bit-shift operation on the plurality of phase control bits to adjust a phase of the output clock signal.

2. The quadrant alternate switching phase interpolator of claim 1, wherein the first signal and the second signal are alternately switched, in order to control a quadrant corresponding to the phase.

3. The quadrant alternate switching phase interpolator of claim 1, wherein when the phase is switched from a first quadrant to a second quadrant, the first multiplexer circuit outputs another one of the first clock signal and the second clock signal to be the first signal in response to the first bit and the third bit, and the second multiplexer circuit keeps outputting the one of the third clock signal and the fourth clock signal to be the second signal.

4. The quadrant alternate switching phase interpolator of claim 1, wherein before the phase is switched from a first quadrant to a second quadrant, the controller circuitry is further configured to predict a quadrant switching direction of the phase.

5. The quadrant alternate switching phase interpolator of claim 1, wherein the controller circuitry comprises:
a plurality of logic gate circuits configured to generate an update signal according to a first state signal, a first phase control bit and a last phase control bit in the plurality of phase control bits, a first phase adjustment signal, and a second phase adjustment signal;
an interval adjustment circuit configured to generate a shift trigger signal according to a clock signal and the update signal;
a state prediction circuit configured to update the first state signal according to the shift trigger signal;
a first shift register circuit configured to store the quadrant control code, and perform the bit-shift operation on the quadrant control code according to the shift trigger signal and at least one of the first phase adjustment signal and the second phase adjustment signal; and
a second shift register circuit configured to store the plurality of phase control bits and perform the bit-shift operation on the plurality of phase control bits according to the first state signal, the clock signal, and at least one of the first phase adjustment signal and the second phase adjustment signal.

6. The quadrant alternate switching phase interpolator of claim 5, wherein the plurality of logic gate circuits comprise:
a first logic gate circuit configured to generate a third signal according to the last phase control bit and the first state signal;
a second logic gate circuit configured to generate a fourth signal according to the first phase control bit and the first state signal;
a third logic gate circuit configured to generate a fifth signal according to the first phase control bit and the third signal;
a fourth logic gate circuit configured to generate a sixth signal according to the fourth signal and the second phase adjustment signal; and
a fifth logic gate circuit configured to generate the update signal according to the fifth signal and the sixth signal.

7. The quadrant alternate switching phase interpolator of claim 6, wherein each of the first logic gate circuit, the third logic gate circuit, and the fourth logic gate circuit is a XOR gate circuit, the second logic gate circuit is a XNOR gate circuit, and the fifth logic gate circuit is an OR gate circuit.

8. The quadrant alternate switching phase interpolator of claim 5, wherein the interval adjustment circuit comprises:
a flip flop circuit configured to output the update signal to be a seventh signal according to the clock signal; and
a first logic gate circuit configured to generate the shift trigger signal according to the seventh signal and the clock signal.

9. The quadrant alternate switching phase interpolator of claim 5, wherein the state prediction circuit comprises:
a flip flop circuit configured to output a second state signal to be the first state signal according to the shift trigger signal; and
an inverter circuit configured to output the second state signal according to the first state signal.

10. The quadrant alternate switching phase interpolator of claim 1, wherein the controller circuitry is configured to sequentially switch each of the plurality of phase control bits from a first logic value to a second logic value, in order to adjust the phase.

11. The quadrant alternate switching phase interpolator of claim 1, wherein a number of bits being changed in the bit-shift operation in the plurality of phase control bits is one.

12. The quadrant alternate switching phase interpolator of claim 1, wherein the controller circuitry is further configured to perform the bit-shift operation on the quadrant control code, in order to switch the phase from a first quadrant to a second quadrant.

13. The quadrant alternate switching phase interpolator of claim 12, wherein a number of bits being changed by the bit-shift operation in the quadrant control code is two.

14. The quadrant alternate switching phase interpolator of claim 1, further comprising:
a synchronous circuit configured to output the first bit and the third bit to the first multiplexer circuit according to a first synchronous signal, and output the second bit and the fourth bit to the second multiplexer circuit according to a second synchronous signal,
wherein the first synchronous signal or the second synchronous signal is a signal having a phase leads the phase of the output clock signal by 90 degrees.

15. The quadrant alternate switching phase interpolator of claim 14, wherein the synchronous circuit comprises:
a third multiplexer circuit configured to output one of the first clock signal and the second clock signal to be the first synchronous signal according to a first switching signal;
a fourth multiplexer circuit configured to output one of the third clock signal and the fourth clock signal to be the second synchronous signal according to a second switching signal;
a first latch circuit configured to output the first bit and the third bit to the first multiplexer circuit according to the first synchronous signal, wherein the first synchronous signal is inputted to an inverting input terminal of the first latch circuit; and
a second latch circuit configured to output the second bit and the fourth bit to the second multiplexer circuit according to the second synchronous signal, wherein the second synchronous signal is inputted to an inverting input terminal of the second latch circuit.

16. The quadrant alternate switching phase interpolator of claim 1, wherein each of the first multiplexer circuit, the second multiplexer circuit, and the phase interpolator circuitry is an inverter-based digital circuit.

17. A phase adjustment method, comprising:
- outputting a quadrant control code and a plurality of phase control bits, and performing a bit-shift operation on the plurality of phase control bits to adjust a phase of an output clock signal;
- outputting one of a first clock signal and a second clock signal to be a first signal in response to a first bit and a third bit in the quadrant control code, wherein the first clock signal and the second clock signal are different in phase by 180 degrees;
- outputting one of a third clock signal and a fourth clock signal to be a second signal in response to a second bit and a fourth bit in the quadrant control code, wherein the third clock signal and the fourth clock signal are different in phase by 180 degrees, and the first clock signal and the third clock signal are different in phase by 90 degrees; and
- generating the output clock signal in response to the first signal, the second signal, and the plurality of phase control bits.

18. The phase adjustment method of claim 17, wherein the first signal and the second signal are alternately switched, in order to control a quadrant corresponding to the phase.

19. The phase adjustment method of claim 17, wherein outputting the quadrant control code and the plurality of phase control bits, and performing the bit-shift operation on the plurality of phase control bits to adjust the phase of the output clock signal comprises:
- sequentially switching each of the plurality of phase control bits from a first logic value to a second logic value, in order to adjust the phase.

20. The phase adjustment method of claim 17, wherein outputting the quadrant control code and the plurality of phase control bits, and performing the bit-shift operation on the plurality of phase control bits to adjust the phase of the output clock signal further comprises:
- performing the bit-shift operation on the quadrant control code, in order to switch the phase from a first quadrant to a second quadrant.

* * * * *